(12) United States Patent
Hwang et al.

(10) Patent No.: US 9,117,867 B2
(45) Date of Patent: Aug. 25, 2015

(54) ELECTROSTATIC CHUCK ASSEMBLY

(75) Inventors: Bernard L. Hwang, Santa Clara, CA (US); Jose Antonio Marin, San Jose, CA (US); Son T. Nguyen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 546 days.

(21) Appl. No.: 13/536,098

(22) Filed: Jun. 28, 2012

(65) Prior Publication Data

US 2013/0001899 A1 Jan. 3, 2013

Related U.S. Application Data

(60) Provisional application No. 61/504,000, filed on Jul. 1, 2011.

(51) Int. Cl.
*H01L 21/683* (2006.01)
*H01L 21/687* (2006.01)

(52) U.S. Cl.
CPC ...... *H01L 21/6833* (2013.01); *H01L 21/68785* (2013.01); *Y10T 279/23* (2015.01)

(58) Field of Classification Search
USPC .............................. 219/494, 444.1
See application file for complete search history.

(56) References Cited

U.S. PATENT DOCUMENTS

| | | | | |
|---|---|---|---|---|
| 6,138,745 A * | 10/2000 | Moslehi | ........................ | 165/80.1 |
| 6,583,979 B1 * | 6/2003 | Takahasi et al. | ............... | 361/234 |
| 6,669,783 B2 * | 12/2003 | Sexton et al. | .................. | 118/728 |
| 8,194,384 B2 * | 6/2012 | Nasman et al. | ............... | 361/234 |
| 2003/0106196 A1 * | 6/2003 | Diaz et al. | ....................... | 29/17.2 |
| 2006/0120011 A1 * | 6/2006 | Handa et al. | .................. | 361/234 |
| 2010/0248497 A1 | 9/2010 | Bevan et al. | | |

FOREIGN PATENT DOCUMENTS

| | | | |
|---|---|---|---|
| EP | 2 015 343 A2 | 1/2009 | |
| WO | WO 2010/011521 A2 | 1/2010 | |

OTHER PUBLICATIONS

International Search Report and Written Opinion mailed Nov. 30, 2012 for PCT Application No. PCT/US2012/044838.

* cited by examiner

*Primary Examiner* — Dana Ross
*Assistant Examiner* — Renee L Miller
(74) *Attorney, Agent, or Firm* — Moser Taboada; Alan Taboada

(57) ABSTRACT

Embodiments of electrostatic chucks for substrate processing are provided herein. In some embodiments, an electrostatic chuck may include a puck for supporting a substrate, the puck formed from a dielectric material and having a chucking electrode disposed within the puck proximate a support surface of the puck to electrostatically retain the substrate when disposed on the puck; a base having a ring extending from the base to support the puck; and a spacer disposed between the base and the puck to support the puck above the base such that a gap is formed between the puck and the base, wherein the spacer supports the puck proximate a peripheral edge of the puck.

20 Claims, 3 Drawing Sheets

ELECTROSTATIC CHUCK ASSEMBLY

CROSS-REFERENCE TO RELATED APPLICATIONS

This application claims benefit of U.S. provisional patent application Ser. No. 61/504,000, filed Jul. 1, 2011, which is herein incorporated by reference.

FIELD

Embodiments of the present invention generally relate to semiconductor processing equipment.

BACKGROUND

Conventional electrostatic chuck construction typically consists of a ceramic disc, or puck, mounted atop a cooling plate or other electrostatic chuck component. However, the inventors have observed that by mounting the ceramic puck in such a manner, the amount of heat transferred from the puck to the cooling plate or other electrostatic chuck components limits the temperature that the puck can be raised to, and therefore limits the temperature to which a substrate disposed on the puck can be heated, thereby limiting the available window of process parameters that may be utilized for processing.

Accordingly, the inventors have provided an improved electrostatic chuck assembly.

SUMMARY

Embodiments of electrostatic chucks for substrate processing are provided herein. In some embodiments, an electrostatic chuck may include a puck for supporting a substrate, the puck formed from a dielectric material and having a chucking electrode disposed within the puck proximate a support surface of the puck to electrostatically retain the substrate when disposed on the puck; a base and a ring extending from the base to support the puck; and a spacer disposed between the base and the puck to support the puck above the base such that a gap is formed between the puck and the base.

In some embodiments, an electrostatic chuck may include a puck for supporting a substrate, the puck formed from a dielectric material and having a chucking electrode disposed within the puck proximate a support surface of the puck to electrostatically retain the substrate when disposed on the puck; a base; a ring disposed atop the base and extending from the base to form a space above the base and within the ring; and a spacer disposed between the ring and the puck to support the puck above the base such that a gap including the space is formed between the puck and the base, wherein the spacer supports the puck proximate a peripheral edge of the puck.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
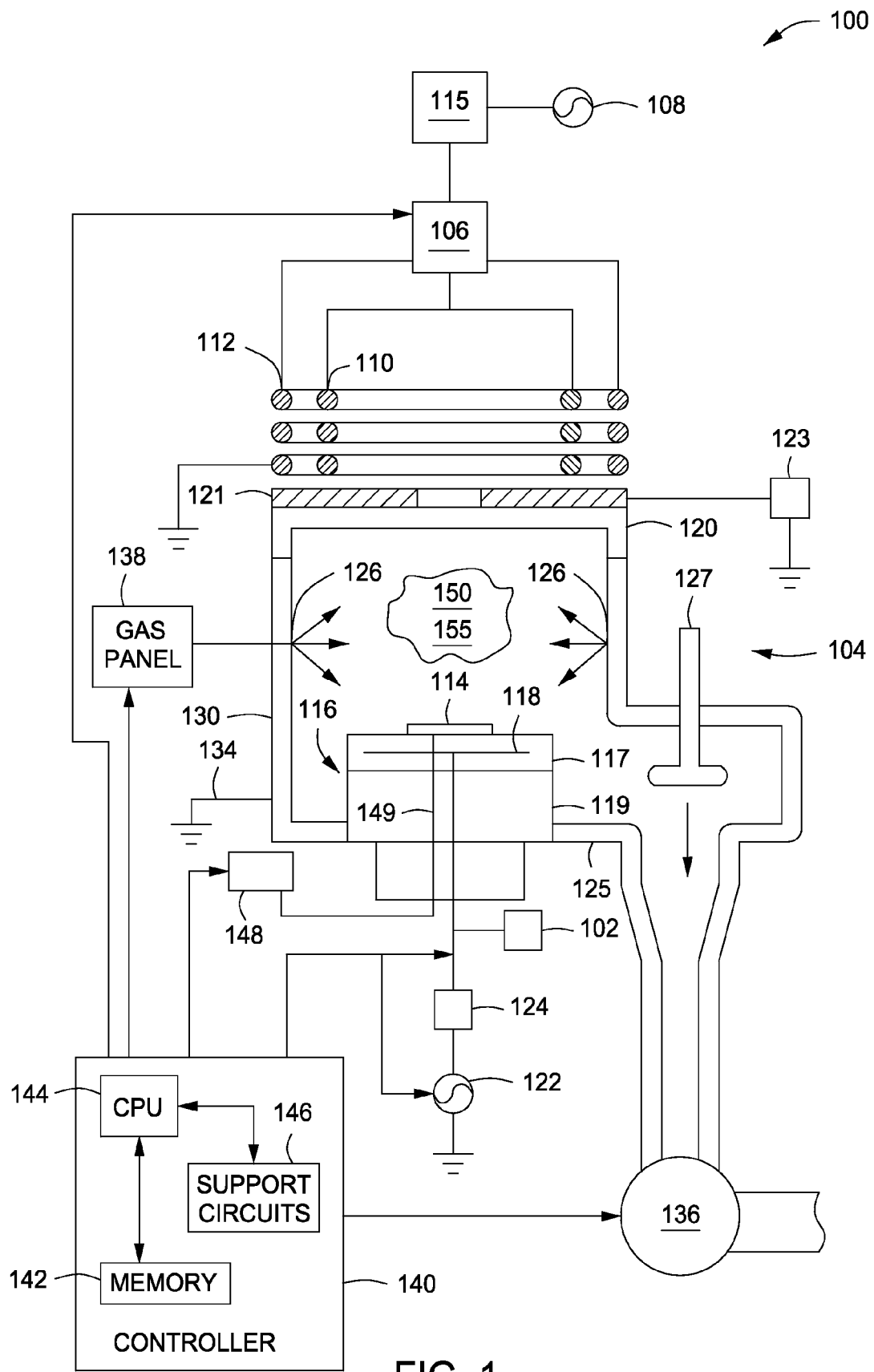
FIG. 1 depicts a process chamber suitable for use with an electrostatic chuck in accordance with some embodiments of the present invention.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation unless incompatible therewith or explicitly stated to the opposite.

DETAILED DESCRIPTION

Embodiments of electrostatic chucks for substrate processing are provided herein. Embodiments of the inventive electrostatic chuck may advantageously allow for substrate supporting components (e.g., the puck) and the substrate disposed thereon to be heated to a higher temperature without having to increase an internal temperature of the process chamber. In embodiments where the inventive electrostatic chuck is utilized in a process chamber configured to perform nitridation processes, by maintaining the puck at a higher temperature without raising the internal temperature of the process chamber, the inventors have observed that an ammonia ($NH_3$) containing plasma may be utilized in place of a conventionally used nitrogen ($N_2$) plasma, thereby providing a higher density plasma, and thus, a higher density nitridation film. The inventive electrostatic chuck further advantageously provides a base assembly that comprises fewer parts, is less expense to manufacture and easier to maintain, as compared to conventional base assemblies.

FIG. 1 depicts a process chamber 100 suitable for use with the inventive electrostatic chuck in accordance with some embodiments of the present invention. The process chamber 100 may be utilized alone or, as a processing module of an integrated semiconductor substrate processing system, or cluster tool, such as CENTURA® DPN Gate Stack integrated semiconductor wafer processing system, available from Applied Materials, Inc. of Santa Clara, Calif. The process chamber 100 may be any type of process chamber suitable for semiconductor processing. Exemplary chambers suitable for use with the present invention are any chamber configured for decoupled plasma nitridation (DPN) available from Applied Materials, Inc. of Santa Clara, Calif.

The process chamber 100 generally includes a chamber body 104 having walls 130 and a dielectric lid 120 (that together define a processing volume), a substrate support 116 disposed within the processing volume, and a controller 140. In some embodiments, the walls 130 may be conductive. In such embodiments, the walls 130 may be coupled to an electrical ground 134.

In some embodiments, the dielectric lid 120 may be substantially flat. Other modifications of the process chamber 100 may have other types of lids such as, for example, a dome-shaped lid or other shapes. In some embodiments, one or more RF coils (two RF coils 110, 112 shown) may be coaxially disposed proximate the dielectric lid 120 and configured to inductively couple RF power into the chamber body 104 to form a plasma 155 from one or more process gases provided to the process chamber 100 via, for example, a gas panel 138. The relative position, ratio of diameters of each coil, and/or the number of turns in each coil can each be adjusted as desired to control, for example, the profile or density of the plasma being formed.

One or more RF power supplies (one RF power supply 108 shown) provide RF power to the RF coils 110, 112 via a match network 115 and an RF feed structure 106. The RF power supply 108 may illustratively be capable of producing up to 4000 W at a tunable frequency in a range from 50 kHz to 13.56 MHz, although other frequencies and powers may be provided as desired for particular applications.

In some embodiments, the match network 115 may include a power divider to control the amount of RF power provided to each antenna coil (thereby facilitating control of plasma characteristics in zones corresponding to the inner and outer coils). The dual coil antenna configuration may advantageously provide improved control of nitrogen dosage within each zone. In some embodiments, the power divider may be a separate component and not part of the match network 115.

In some embodiments, the RF feed structure 106 is configured to provide the RF current to the RF coils in a symmetric manner, such that the RF current is coupled to each coil in a geometrically symmetric configuration with respect to a central axis of the RF coils.

In some embodiments, a heater element 121 may be disposed atop the dielectric lid 120 to facilitate heating the interior of the process chamber 100. The heater element 121 may be disposed between the dielectric lid 120 and the first and second RF coils 110, 112. In some embodiments, the heater element 121 may include a resistive heating element and may be coupled to a power supply 123, such as an AC power supply, configured to provide sufficient energy to control the temperature of the heater element 121. In some embodiments, the heater element 121 may be an open break heater. In some embodiments, the heater element 121 may comprise a no break heater, such as an annular element, thereby facilitating uniform plasma formation within the process chamber 100.

During operation, a substrate 114 (such as a semiconductor wafer or other substrate suitable for plasma processing) may be placed on the substrate support 116 and process gases may be supplied from a gas panel 138 through entry ports 126 to form a gaseous mixture 150 within the chamber body 104. The gaseous mixture 150 may be ignited into a plasma 155 by applying power from the plasma source 108 to the first and second RF coils 110, 112 and optionally, the one or more electrodes (not shown). In some embodiments, power from the bias source 122 may be also provided to the substrate support 116. The pressure within the interior of the chamber body 104 may be controlled using a throttle valve 127 and a vacuum pump 136. The temperature of the chamber wall 130 may be controlled using liquid-containing conduits (not shown) that run through the wall 130.

The temperature of the substrate 114 may be controlled by stabilizing a temperature of the substrate support 116. In some embodiments, a heat controlling gas, for example such as helium, may be provided from a gas source 148 to channels defined between the backside of the substrate 114 and grooves (not shown) disposed in a substrate support surface via a gas conduit 149. The heat controlling gas is used to facilitate heat transfer between the substrate support 116 and the substrate 114. During processing, the substrate support 116 may be heated by a resistive heater (not shown) to a steady state temperature and the helium gas may facilitate uniform heating of the substrate 114. Using such thermal control, the substrate 114 may be maintained at a temperature of about 0 to about 550 degrees Celsius.

The controller 140 comprises a central processing unit (CPU) 144, a memory 142, and support circuits 146 for the CPU 144 and facilitates control of the components of the process chamber 100. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and sub-systems, and the like. Algorithms to control the components of the process chamber 100 or processes performed within the process chamber 100 may be stored in the memory 142 as software routine that may be executed or invoked to control the operation of the process chamber 100 in the manner described above. The software routine may also be stored and/or executed by a second CPU (not shown) that is remotely located from the hardware being controlled by the CPU 144.

The substrate support 116 generally comprises a base 119 disposed proximate a wall (e.g., the bottom 125) of the chamber body 104 and configured to support an electrostatic chuck 117. In some embodiments, the substrate support 116 may comprise an electrode 118 for coupling to a power source. For example, in some embodiment, the electrode 118 may be coupled to a DC power source 102 to provide a chucking voltage to the electrode 118 when electrostatically retaining the substrate 114 to the substrate support 116. Alternatively or in combination, the electrode 118 may be coupled through a matching network 124 to an RF bias power source 122. In some embodiments, the DC power source 102 and the RF bias power source 122 may be coupled to different electrodes disposed in the substrate support 116.

Figure 2:
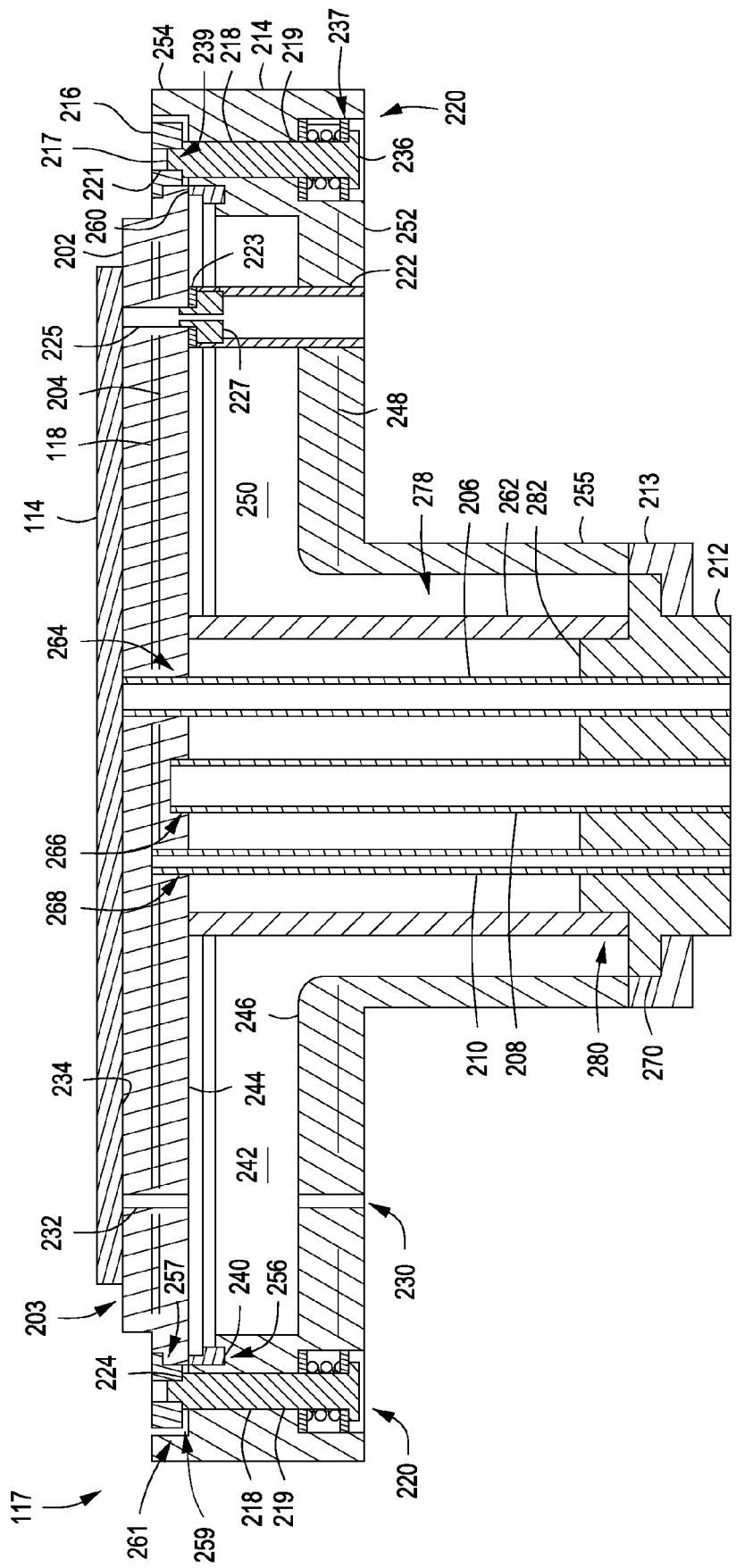
FIG. 2 depicts a cross-sectional view of the electrostatic chuck in accordance with at least some embodiments of the invention.

Referring to FIG. 2, in some embodiments, the electrostatic chuck 117 may generally comprise a support 214 configured to support a puck 202 and a spacer 240 disposed between the support 214 and the puck 202 to provide a gap 242 between a bottom surface 244 of the puck 202 and a top surface 246 of the support 214.

The support 214 may generally comprise a hollow shaft, or tube 255 supporting a base 252. A ring 254 may be disposed atop the base 252, extending above the base 252 to form a space 250 above the base 252 and within the ring 254. The support 214 may be fabricated from any suitable material, for example, a metal such as aluminum, stainless steel, or the like. In some embodiments, a top portion of the ring 254 may comprise contouring or notching (e.g., notches 261, 256) to facilitate coupling the puck 202 to the support 214 while maintaining the desired gap 242 between the puck 202 and support 214. Although described as separate components (i.e., the tube 255, base 252, and ring 254), any two or more of these components may be fabricated from a single piece of material, thereby providing the support 214 having fewer components, or a unitary design. In some embodiments, the support 214 may include one or more lift pin holes (one lift pin hole 230 shown) to allow a lift pin (described below) to pass through the support 214 and puck 202 to facilitate delivery and removal of the substrate 114 to and from the electrostatic chuck 117.

In some embodiments, the support 214 may include one or more conduits 248 disposed within the support 214 to allow a flow of coolant through the support 214 to facilitate maintaining control over a temperature of the electrostatic chuck 117. The conduits 248 may be configured in any manner suitable to provide the aforementioned temperature control. For example, in some embodiments, the conduits 248 may be disposed within the base 252 such as shown in FIG. 2. Alternatively, or in combination, in some embodiments, the conduits may be disposed within, or extend through the ring 254 to facilitate temperature control of the ring 254.

In some embodiments, the support 214 may include one or more through holes (two through holes 218 shown) to allow a fastener 219 to be disposed through the support 214 to facilitate securing the puck 202 to the support 214. In some embodiments, the support 214 may include a cavity 220 configured to accommodate the fastener 219 such that when fastened, little or no portion of the fastener 219 extends beyond a surface of the support 214.

The fastener 219 may be any type of fastener suitable for use in an electrostatic chuck, for example a bolt. In some embodiments, the fastener may comprise a first end 237 having a head 236 to interface with a tool and a second end 239 having a threaded portion 217. In some embodiments, the fastener 219 may be spring loaded to facilitate providing enough force to secure the puck 202 to the support 214 (e.g., via clamp ring 216 disposed atop the support 214 as described below) while not damaging any of the support 214 components, for example, such as shown in FIG. 2.

In some embodiments, the threaded portion 217 may be configured to interface with a threaded through hole 221 formed in a clamp ring 216 to secure the puck 202 to the support 214. In such embodiments, the fastener 219 may include a shoulder 224 configured to maintain a gap 259 between the clamp ring 216 and the support 214 to minimize heat transfer between the clamp ring 216 and/or puck 202, thereby allowing the puck 202 to be heated more efficiently and maintain a higher temperature without raising the internal temperature of the process chamber during processing.

The clamp ring 216 may be fabricated from any material suitable to secure the puck 202 while withstanding degradation due to the environment within the process chamber (e.g. process chamber 100 described above) during processing. For example, in some embodiments, the clamp ring 216 may be fabricated from titanium (Ti). The inventors have discovered that the titanium clamp ring 216 withstands degradation from processing within the process chamber 100 and actually reduces or eliminates metal contamination of the substrate and/or of process chamber components resultant from processing.

In some embodiments, the support 214 may comprise a conduit 222 to interface with a through hole 225 formed in the puck 202 to allow a gas to be flowed to a back surface 234 of the substrate 114 to facilitate monitoring whether the substrate 114 is adequately chucked to the puck 202. In some embodiments, a flow plug 227 may be coupled to the conduit 222 and configured to interface with the through hole 225 to facilitate a secure coupling of the conduit 222 and through hole 225. In some embodiments, a seal 223 may be disposed between the conduit 223 and a portion of the flow plug 227 and the puck 225 to provide an airtight fit. The seal 223 may be fabricated from any suitable material. For example, in some embodiments, the seal 223 may be a metal e-seal comprising an alloy such as a nickel chromium alloy, or the like. Although only one conduit 223 is shown, the support 214 may include any number of conduits 223, for example, such as two or more. However, the inventors have observed that by providing one conduit 223, adequate monitoring of the substrate 114 chucking may be performed while reducing the cost and complexity of the electrostatic chuck 117 as compared to conventional electrostatic chucks utilizing more than one or more (e.g., ten or more) conduits 222.

The puck 202 is generally a cylindrical, plate-like member having a top surface 203 for supporting and retaining the substrate 114 during processing and an opposing bottom surface 244 facing the support 214. The puck 202 may have a circumferential notch 257 disposed about the peripheral edge of the top surface 203 to interface with the clamp ring 216 to facilitate securing the puck 202 to the support 214, as described above. The puck 202 may be fabricated from any suitable process-compatible, electrically insulating material, for example, such as a material having a high dielectric constant. In some embodiments, the puck 202 may be fabricated from a ceramic, such as aluminum nitride (AlN). The puck 202 includes a chucking electrode (e.g., the electrode 118), such as a conductive mesh, embedded therein. The electrode 118, may be energized with a DC voltage (e.g., from the DC power source 102), to create an electrostatic field between the substrate 114 and the puck 202 to retain the substrate 114 upon the top surface 203 of the puck 202. In some embodiments, the electrode 118 may also be used as an RF bias electrode and may be coupled to a source of RF energy, such as the bias power source 122. In some embodiments, the puck 202 may further comprise a heater 204 embedded in the puck 202. In some embodiments, the heater 204 may be arranged in a plurality of independently controllable heating zones. When present, the heater 204 may comprise one or more heater elements (e.g., resistive heating elements) and may be utilized to provide heat to the puck 202 and, ultimately, to the substrate 114 to facilitate control (in combination with other components) of the temperature of the substrate 114.

In some embodiments, the puck 202 may include one or more features to facilitate handling and/or processing of the substrate 114. For example, in some embodiments, one or more lift pin holes 232 (one lift pin hole 232 shown) may be provided through the puck 202 to allow a lift pin to pass through the puck 202 to facilitate raising or lowering the substrate 114 from the puck 202. Any suitable number of lift pin holes may be utilized, for example, such as three lift pin holes disposed about 120 degrees from one another about the puck 202.

The spacer 240 is generally shaped as a ring and supports the puck 202 above the support 214 to provide a gap 242 between the bottom surface 244 of the puck 202 and a top surface 246 of the support 214. In some embodiments, the spacer 240 supports the puck 202 about a peripheral edge 260 of the puck 202. In some embodiments, the spacer 240 may be disposed within a notch 256 formed in a surface of the ring 254 to allow the spacer 240 to sit securely on the support 214.

By providing the gap 242 between the bottom surface 244 of the puck 202 and a top surface 246 of the support 214 the inventors have observed that heat transfer from the puck 202 to the support 214 may be reduced, thereby allowing the puck 202 to be maintained at a higher temperature without raising the internal temperature of the process chamber. Accordingly, the gap 242 may have any dimensions suitable to limit the desired amount of heat transferred from the puck 202 to the support 214. For example, in some embodiments, the gap 242 may have a height of about 1.25 to about 1.50 cm.

The inventors have also observed that in embodiments where the electrostatic chuck 117 is utilized in a process chamber configured to perform nitridation processes, by maintaining the puck 202 at a higher temperature (e.g., above about 350 degrees Celsius, or in some embodiments, about 450 degrees Celsius) without raising the internal temperature of the process chamber, an ammonia ($NH_3$) containing plasma may be utilized in place of a conventionally used nitrogen (N$_2$) plasma, thereby providing a higher density plasma, and thus, a higher density nitridation film may be advantageously obtained.

The spacer 240 may be fabricated from any material suitable to support the puck 202, for example, such as titanium (Ti). By providing a titanium spacer 240, the inventors have observed that metal contamination may be reduced or eliminated during processing. The spacer 240 may have any dimensions suitable to support the puck 202. For example, in some embodiments, the spacer 240 may have a puck support surface having a width of about 0.10 to about 0.11 mm. The inventors have observed that by providing the spacer 240 having a puck support surface with a width that is less than conventional spacers, heat transfer between the puck 202 and the support 214 may further be reduced.

In some embodiments, a conduit 262 may be disposed within the tube 255 to house one or more resource conduits (three resource conduits 206, 208, 210 shown) to facilitate delivery of various processing resources to the puck 202. In some embodiments, the conduit 262 may be sufficiently sized such that a gap 278 is maintained between the conduit 262 and tube 225 to facilitate venting the gap 242 away from the puck 202 to reduce plasma exposure to the bottom surface 244 of the puck 202. In some embodiments, a first resource conduit (e.g., resource conduit 206) may be disposed in the conduit 262 and coupled to a through hole 264 formed in the puck 202 to provide a gas (e.g., helium) to facilitate cooling of the back surface 234 of the substrate 114. In some embodiments, a second resource conduit (e.g., resource conduit 208) may be disposed in the conduit 262 and coupled to a recess 266 formed in the puck 202 to position a thermocouple within the puck 202 to monitor a temperature of the puck 202. In some embodiments, a third resource conduit (e.g., resource conduit 210) may be disposed in the conduit 262 and coupled to a recess 268 formed in the puck 202 to provide a coupling from a power source (e.g., the DC power source 102 or the bias power source 122 described above) to the electrode 118. In some embodiments, the third resource conduit may also be utilized to couple power to the heater 204. Alternatively, a different resource conduit (e.g., a fourth resource conduit) may be used.

In some embodiments, an insulator block 212 may be disposed proximate a first end 280 of the conduit 262 and at least partially within the conduit 262 to facilitate coupling the one or more processing resource supplies (not shown) to the conduits disposed within the conduit 262 (i.e., resource conduits 206, 208, 210). The insulator block may be fabricated from any suitable electrically insulating material, for example, such as a ceramic. In some embodiments, the insulator block 212 may comprise a flange 270 configured to interface with a ring 213 to facilitate coupling the insulator block 212 to the conduit 262. The insulator block 212 may have any dimensions suitable in length from the flange to a first end 282 of the insulator block 212 disposed within the conduit 262. In some embodiments, the length may be about 2.0 to about 2.1 cm. The inventors have observed that by providing the insulator block 212 having dimensions (i.e., the aforementioned length) larger than conventionally used insulator blocks, the insulator block 212 may provide an increased amount of heat transfer from conduit 262 to the insulator block 212 thus providing an increased cooling of the conduit 262 and an improved connectivity between the process resource supplies and the resource conduits (resource conduits 206, 208, 210).

Figure 3:
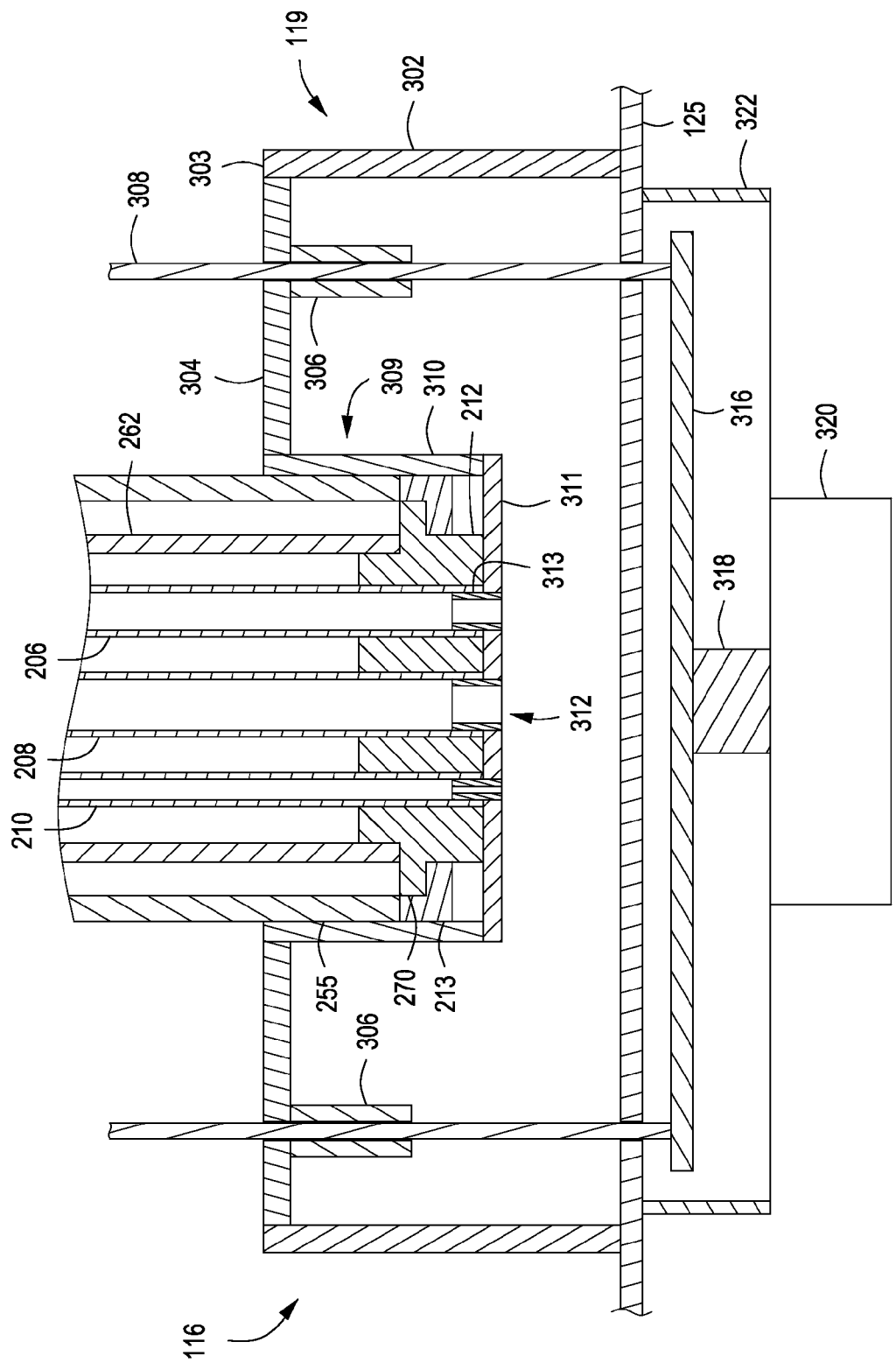
FIG. 3 depicts a cross-sectional view of a base assembly for use with an electrostatic chuck in accordance with some embodiment s of the present invention.

Referring to FIG. 3, the base 119 generally comprises an outer wall 302, a lift pin guide 304 and a recess 309 configured to interface with the tube 255 of the support 214 (described above). The base 119 may be fabricated from any material, for example a metal, such as stainless steel, aluminum, or the like.

The outer wall 302 may be coupled to a wall (e.g., the bottom 125) of a process chamber (e.g., process chamber 100 described above) and is configured to support the electrostatic chuck 117 (described above). In some embodiments, a top edge 303 of the outer wall 302 is configured to couple the base 119 to the support 214 (described above). The outer wall 302 may comprise any thickness suitable to provide support to the electrostatic chuck 117. For example, in some embodiments, the outer wall may have a thickness of about 0.86 to about 0.96 cm. The inventors have observed that by providing the outer wall 302 having such a thickness, other conventionally used components of base assemblies (e.g., liners, additional skirts, or the like) may be excluded from the base 119, thereby providing a base 119 assembly that has fewer parts, and therefore is less costly to manufacture.

The lift pin guide 304 provides guidance for the lift pins 308 during removal and delivery of a substrate to the electrostatic chuck (e.g., substrate 114 to electrostatic chuck 117 as described above). In some embodiments, one or more collars (one collar 306 per lift pin 308 shown) may be coupled to the lift pin guide 304 to provide stability to the lift pins 308 during use. By providing the collars 306 coupled to the lift pin guide 304, the inventors have observed that less parts may be required to provide stability to the lift pins 308, as compared to conventional base assemblies that provide a mechanism for stabilizing lift pins (e.g., a collar) with a substrate support.

The recess 309 includes a wall 310 and bottom 311 and interfaces with the tube 255 of the support 214 (described above). The bottom 311 includes one or more through holes (three through holes 312 shown), each having a coupling 313 configured to couple each of the through holes 312 to a respective conduit (i.e., resource conduits 206, 208, 210) of the insulator block 212.

In some embodiments a removable skirt 322 is removably coupled to the bottom 125 and surrounds the lift pin plate 316 and shaft 318. Providing a removable skirt 322 allows for access to the lift pin plate 316 and shaft 318 for maintenance and/or servicing. An actuator 320 is coupled to the shaft 318 and controls vertical movement of the shaft 318, lift pin plate 316 and lift pin 308. The actuator 320 may be any type of actuator capable of providing such movement. In some embodiments, the actuator 320 is a motorized actuator. By providing a motorized actuator to control movement, the inventors have observed an improved controllability of the shaft 318, lift pin plate 316 and lift pin 308 as opposed to conventionally used (e.g., pneumatic) actuators.

Thus, embodiments of electrostatic chucks have been provided herein. Embodiments of the inventive electrostatic chuck may advantageously allow for the substrate supporting components (e.g., the puck) and the substrate disposed thereon to be heated to a higher temperature without having to increase an internal temperature of the process chamber. In embodiments where embodiments where the inventive electrostatic chuck is utilized in a process chamber configured to perform nitridation processes, by maintaining the puck at a higher temperature without raising the internal temperature of the process chamber, the inventors have observed that an ammonia (NH$_3$) containing plasma may be utilized in place of a conventionally used nitrogen (N$_2$) plasma, thereby providing a higher density plasma, and thus, a higher density nitridation film. The inventive electrostatic chuck further advantageously provides a base assembly that comprises fewer parts, is less expense to manufacture and easier to maintain, as compared to conventionally used base assemblies.

While the foregoing is directed to embodiments of the present invention, other and further embodiments of the invention may be devised without departing from the basic scope thereof.

The invention claimed is:

1. An electrostatic chuck, comprising:
   a puck to support a substrate, the puck formed from a dielectric material and having a chucking electrode disposed within the puck proximate a support surface of the puck to electrostatically retain the substrate when disposed on the puck;
   a base having a ring extending from the base to support the puck; and
   a spacer supported atop the ring of the base and disposed between the base and the puck to support the puck above the base such that a gap is formed between the puck and the base, wherein the spacer supports the puck proximate a peripheral edge of the puck.

2. The electrostatic chuck of claim 1, wherein the spacer is fabricated from titanium.

3. The electrostatic chuck of claim 1, wherein the spacer has a puck support surface having a width of about 0.10 to about 0.11 mm.

4. The electrostatic chuck of claim 1, wherein the gap has a height of about 1.25 to about 1.50 cm.

5. The electrostatic chuck of claim 1, further comprising:
   a heater embedded within the puck.

6. The electrostatic chuck of claim 5, wherein the heater comprises a plurality of independently controllable heating zones.

7. The electrostatic chuck of claim 1, further comprising:
   a clamp ring disposed atop an outer peripheral edge of the puck and coupled to the ring of the base to clamp the puck to the base.

8. The electrostatic chuck of claim 7, wherein the clamp ring is fabricated from titanium.

9. The electrostatic chuck of claim 7, further comprising:
   a fastener disposed through the ring to a bottom surface of the base the clamp ring to the base, wherein the fastener maintains the clamp ring spaced apart from the base.

10. The electrostatic chuck of claim 1, wherein the base and the ring are fabricated from aluminum or stainless steel.

11. The electrostatic chuck of claim 1, wherein the base and the ring are fabricated from a single piece of aluminum or stainless steel.

12. The electrostatic chuck of claim 1, further comprising:
    a tube coupled to the base to support the base; and
    a conduit disposed within the tube to route processing resources to the puck.

13. An electrostatic chuck, comprising:
    a puck to support a substrate, the puck formed from a dielectric material and having a chucking electrode disposed within the puck proximate a support surface of the puck to electrostatically retain the substrate when disposed on the puck;
    a base;
    a ring disposed atop the base and extending from the base to form a space above the base and within the ring; and
    a spacer supported atop the ring of the base and disposed between the ring and the puck to support the puck above the base such that a gap including the space is formed between the puck and the base, wherein the spacer supports the puck proximate a peripheral edge of the puck.

14. The electrostatic chuck of claim 13, further comprising:
    a heater embedded within the puck.

15. The electrostatic chuck of claim 14, wherein the heater comprises a plurality of independently controllable heating zones.

16. The electrostatic chuck of claim 13, further comprising:
    a clamp ring disposed atop an outer peripheral edge of the puck and coupled to the ring of the base to clamp the puck to the base.

17. The electrostatic chuck of claim 16, wherein the clamp ring is fabricated from titanium.

18. The electrostatic chuck of claim 13, wherein the spacer is fabricated from titanium.

19. The electrostatic chuck of claim 13, wherein the spacer has a puck support surface having a width of about 0.10 to about 0.11 mm.

20. The electrostatic chuck of claim 13, wherein the gap has a height of about 1.25 to about 1.50 cm.

* * * * *

UNITED STATES PATENT AND TRADEMARK OFFICE
CERTIFICATE OF CORRECTION

| | | |
|---|---|---|
| PATENT NO. | : 9,117,867 B2 | Page 1 of 1 |
| APPLICATION NO. | : 13/536098 | |
| DATED | : August 25, 2015 | |
| INVENTOR(S) | : Bernard L. Hwang, Jose Antonio Marin and Son T. Nguyen | |

It is certified that error appears in the above-identified patent and that said Letters Patent is hereby corrected as shown below:

In the Claims

Column 9, lines 41-42

The phrase "bottom surface of the base the clamp ring" recited in claim 9 should be replaced with the phrase "bottom surface of the base to couple the clamp ring"

Signed and Sealed this
Twelfth Day of January, 2016

Michelle K. Lee
*Director of the United States Patent and Trademark Office*